United States Patent [19]
Kim et al.

[11] Patent Number: 5,821,143
[45] Date of Patent: Oct. 13, 1998

[54] FABRICATION METHODS FOR NONVOLATILE MEMORY DEVICES INCLUDING EXTENDED SIDEWALL ELECTRODE

[75] Inventors: Jae-youn Kim, Yongin; Keon-soo Kim, Suwon, both of Rep. of Korea

[73] Assignee: Samsung Electronics Co., Ltd., Suwon, Rep. of Korea

[21] Appl. No.: 636,072

[22] Filed: Apr. 22, 1996

[30]     Foreign Application Priority Data

Apr. 27, 1995 [KR] Rep. of Korea ............ 1995/10115

[51] Int. Cl.$^6$ ............................................ H01L 21/8247
[52] U.S. Cl. ................................... 438/267; 438/596
[58] Field of Search .................... 438/257, 266, 438/267, 593, 594, 596

[56]          References Cited
          U.S. PATENT DOCUMENTS 5,268,585 12/1993 Yamauchi ................ 438/267

5,494,838 2/1996 Chang et al. ............... 438/267

Primary Examiner—Chandra Chaudhari
Attorney, Agent, or Firm—Myers Bigel Sibley & Sajovec

[57]          ABSTRACT

A nonvolatile memory device includes an extended sidewall electrode which extends onto the substrate away from the sidewall insulating region. The sidewall electrode also preferably extends onto the outer face of the insulated control gate. The extended sidewall electrode is preferably formed by blanket forming a sidewall electrode layer and then patterning the blanket electrode layer to remove a portion thereof on the substrate face and on the outer face of the insulated control gate. Fabrication methods for high speed nonvolatile memory devices with reduced erase errors are thereby provided.

9 Claims, 8 Drawing Sheets

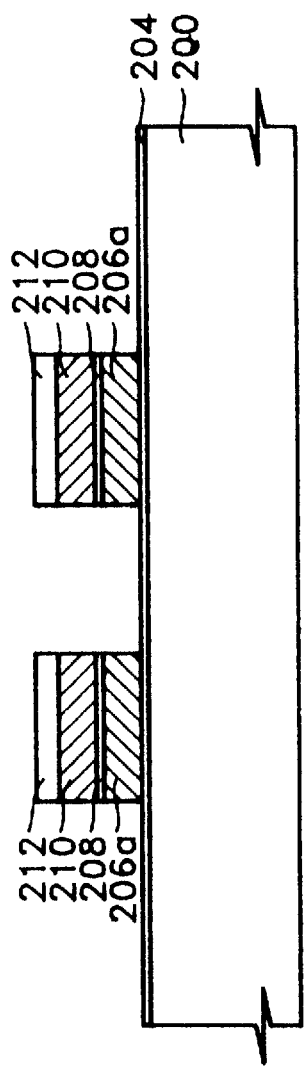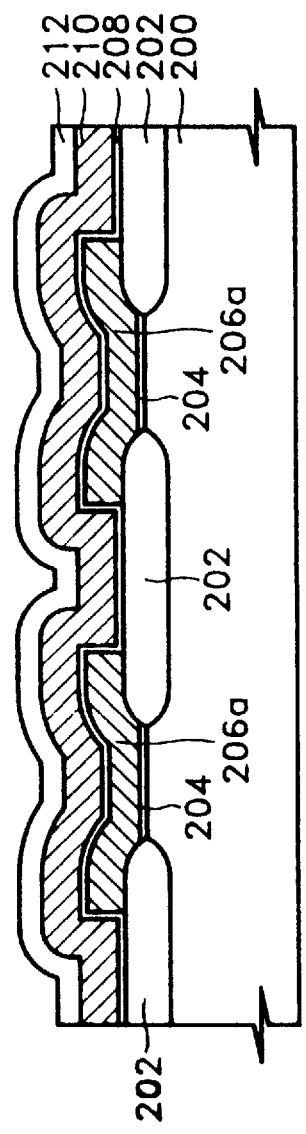

FABRICATION METHODS FOR NONVOLATILE MEMORY DEVICES INCLUDING EXTENDED SIDEWALL ELECTRODE

FIELD OF THE INVENTION

The present invention relates to fabrication methods for semiconductor devices, and more particularly to fabrication methods for nonvolatile memory devices.

BACKGROUND OF THE INVENTION

A nonvolatile memory device does not erase information in a memory cell even if power is interrupted, in contrast to a random access memory. Thus, the nonvolatile memory device is widely used in computers, memory cards and other electronic systems.

A conventional nonvolatile memory device such as a flash memory or an electrically erasable programmable read only memory (EEPROM), includes a semiconductor substrate, spaced apart source and drain regions in the semiconductor substrate, an insulated floating gate on the semiconductor substrate between the spaced apart source and drain regions, and an insulated control gate on the insulated floating gate, opposite the semiconductor substrate. Programming is performed such that the source and the substrate are grounded and a high voltage is applied to the control gate and the drain to inject channel hot carriers generated in the vicinity of the drain into the floating gate. Accordingly, the memory cell is programmed when the device current is reduced during a read operation due to the increased threshold voltage of the device.

During programming by channel hot carriers generated in the drain as described above, the electric field formed in the insulated floating gate adjacent the drain is weaker than adjacent the source. Accordingly, hot carriers are not efficiently injected into the floating gate, thus requiring excessive time to program the device.

In order to reduce programming time, U.S. Pat. No. 4,794,565 to Albert T. Wu et al. describes a nonvolatile semiconductor memory device wherein a floating polysilicon spacer is formed adjacent the source region. The floating polysilicon spacer reduces the programming time by generating hot carriers in the vicinity of the source region and injecting them into the floating gate. FIG. 1 is a typical cell structure of a nonvolatile memory device having a floating polysilicon spacer.

Referring to FIG. 1, reference numeral 10 represents a semiconductor substrate and reference numeral 12 represents a gate insulation film formed on semiconductor substrate 10. Reference numeral 14 represents an insulated floating gate formed on gate insulation film 12 and reference numeral 16 represents an interlayer insulation film formed on insulated floating gate 14. Reference numeral 18 represents an insulated control gate formed on interlayer insulation film 16 and reference numeral 20 represents an insulation film covering control gate 18 and floating gate 14. Reference numeral 22 represents a floating polysilicon spacer formed along one sidewall of the insulation film 20, reference numeral 24 represents a source region overlapped with floating polysilicon spacer 22 and formed on semiconductor substrate 10 and reference numeral 26 represents a drain region overlapped with floating gate 14 and formed in semiconductor substrate 10 to face source region 24. Reference numeral 28 represents a first channel region formed beneath semiconductor substrate 10 below floating polysilicon spacer 22, reference numeral 30 represents a second channel region formed beneath semiconductor substrate 10 below insulation film 20 positioned between floating gate 14 and floating polysilicon spacer 22, and reference numeral 32 represents a third channel region formed beneath semiconductor substrate 10 below floating gate 14.

Still referring to FIG. 1, second channel region 30 is used to program the cell. In particular, programming in the above-described cell structure is performed by grounding source region 24 and semiconductor substrate 10, and by applying 12 V and 5 V to control gate 18 and drain region 26, respectively. A channel electric field (lateral electric field) and a gate electric field (vertical electric field) having a large magnitude are formed laterally in second channel region 30 and gate insulation film 12 formed thereon, respectively. The gate electric field formed adjacent the source region is stronger than that formed adjacent the drain region. Thus, large numbers of hot carriers generated by the electric field formed on second channel region 30 are injected into floating gate 14 by the large gate electric field. This provides greater injection efficiency of hot carriers in the cell structure shown in FIG. 1 compared to a cell without floating polysilicon spacer 22, first channel region 28 and second channel region 30.

Unfortunately, when a programmed cell which shares a bit line with an erased cell having a negative threshold voltage is read, improper operation may occur. Improper operation may occur due to reading the information from the erased cell because the transistor of the unselected erased cell may be turned on by the floating polysilicon spacer 22 in the selected and unselected cells, which causes excessive current to flow through the bit line.

U.S. Pat. No. 4,794,565 further discloses several additional embodiments other than FIG. 1. According to these additional embodiments, the above described improper operation due to erased cells can be solved. Unfortunately, since the area of overlap between a floating gate and a control gate is generally small, the coupling ratio which affects programming is reduced, or the cell area becomes larger. To solve these problems, a cell structure having a sidewall gate electrode adjacent the source region has been proposed in U.S. Pat. No. 5,235,544 by John Caywood. FIGS. 2 and 3 show a conventional cell structure having the sidewall gate electrode and a portion of a cell array diagram, respectively, according to the aforesaid Caywood patent.

Referring to FIG. 2, reference numeral 40 represents a semiconductor substrate and reference numeral 42 represents a floating gate formed over semiconductor substrate 40, and spaced apart from the substrate by a gate insulation film. Reference numeral 44 represents a control gate electrode spaced apart from the floating gate 42 by an interlayer insulation film. Reference numeral 46 is a sidewall gate electrode spaced apart by an insulation film and formed along one sidewall formed by stacked control gate electrode 44 and floating gate 42. Reference numeral 48 represents a drain region overlapping floating gate 42 and formed in semiconductor substrate 40, and a reference numeral 50 represents a source region overlapped with sidewall gate electrode 46 and formed on semiconductor substrate 10 to face drain region 48.

In the cell shown in FIG. 2, programming is performed by grounding source region 50, by applying 5 V to drain region 48 and by applying 12 V to 18 V and 1.5 V to 2.5 V to control gate electrode 44 and sidewall gate electrode 46, respectively. Hot carriers which are generated in the vicinity of source region 50 are then injected into floating gate 42. Also, information is erased by a tunneling current through the thin gate insulation film formed on the overlapping portion of drain region 48 and floating gate 42. In particular, source region 50 is floated and 5 V and −8 V to −13 V are applied respectively to drain region 48 and control gate electrode 44, thereby moving electrons injected into floating gate 42 toward drain region 48 by the Fowler-Nordheim (FN) tunneling effect, to erase the information.

FIG. 3 is an equivalent circuit diagram showing a portion of the cell array region of the two-dimensional cell shown in FIG. 2. Referring to FIG. 3, the operation of reading information of a selected cell 76 is performed by grounding an unselected bit line 62, unselected sidewall gate electrodes 80 and 82 and all source regions 64, 66 and 68. An appropriate voltage, e.g., 0 V to 3 V, is applied to a control gate electrode 70 of a selected cell 76. Unselected control gate electrodes 72 and 74 are grounded, and 1 V to 2 V and 5 V are applied to a selected bit line 60 and a selected sidewall gate electrode 78, respectively. Therefore, during a read operation, the sidewall gate electrodes 80 and 82 of an unselected cell are grounded, thereby preventing a improper operation due to an erased cell. In other words, when an erased cell is not selected, the sidewall gate electrodes of the unselected cell are grounded so that a channel is not formed therebelow, thereby turning off the cell transistor.

Unfortunately, the aforementioned nonvolatile memory device having a cell structure provided with sidewall gate electrodes formed of a polysilicon spacer may have the following disadvantages:

First, it may be difficult to form spacers having a uniform width throughout a semiconductor wafer, thereby producing excessive variability in programming time.

Second, since the width of a spacer is generally narrow, the sidewall gate electrode generally has a large resistance value. The large resistance increases the RC delay time when a sidewall gate electrode is selected, thereby slowing device operation.

Third, it may be difficult to connect a sidewall gate electrode, i.e., a spacer, with an address decoder for selecting a cell. Connection may be difficult because the width of the spacer is generally too narrow to form a contact hole directly thereon.

SUMMARY OF THE INVENTION

It is therefore an object of the present invention to provide improved fabrication methods for nonvolatile memory devices.

It is another object of the present invention to provide fabrication methods for nonvolatile memory devices which can be programmed at high speeds.

It is yet another object of the present invention to provide fabrication methods for nonvolatile memory devices which reduce errors due to erased cells during read operations.

It is still another object of the present invention to provide fabrication methods for nonvolatile memory devices which provide low sidewall gate electrode resistance.

It is still a further object of the invention to provide fabrication methods for nonvolatile memory devices which allow efficient connection of a sidewall gate electrode to a decoder.

These and other objects are provided, according to the present invention, by a nonvolatile memory device which includes an extended sidewall electrode which extends onto the substrate face away from the sidewall insulating region. The sidewall electrode also preferably extends onto the outer face of the insulated control gate. The extended sidewall electrode is preferably formed by blanket forming a sidewall electrode layer and then patterning the blanket electrode layer to remove a portion thereof on the substrate face and on the outer face of the insulated control gate.

In particular, a nonvolatile semiconductor memory device according to the present invention includes a semiconductor substrate and spaced apart source and drain regions in the semiconductor substrate at a face thereof. An insulating floating gate is included on the semiconductor substrate between the spaced apart source and drain regions. The insulated floating gate includes a first end adjacent the source and a second end adjacent the drain. An insulated control gate is included on the insulated floating gate, opposite the semiconductor substrate. The insulated control gate includes a first end adjacent the source and a second end adjacent the drain. A sidewall insulating region extends from the substrate face adjacent the first end of the insulated floating gate, across the first end of the insulated floating gate and onto the first end of the control gate.

An extended sidewall electrode is provided on the sidewall insulating region opposite the insulated floating gate and the insulated control gate. The extended sidewall electrode extends from adjacent the first end of the insulated control gate and onto the substrate face. The extended sidewall electrode further extends on the substrate face away from the sidewall insulating region. Preferably, the sidewall electrode further extends from the sidewall insulating region onto the outer face of the insulated control gate between the first and second ends of the insulated control gate and opposite the insulated floating gate.

In a preferred embodiment of the invention, the nonvolatile semiconductor device further includes a second sidewall insulating region which extends from the substrate face adjacent the second end of the insulated floating gate across the second insulated floating gate and onto the second end of the control gate. A second sidewall electrode is also included on the sidewall insulating region opposite the insulated floating gate and the insulated control gate. The second sidewall electrode extends from adjacent the second end of the insulated control gate and onto the substrate face to electrically contact the drain region. The second sidewall electrode also preferably further extends from the sidewall insulating region onto the outer face of the insulated control gate.

In fabrication methods according to the invention, an insulated floating gate and an insulated control gate are formed on a face of a semiconductor substrate, wherein the insulated floating gate and the insulated control gate each include first and second ends. A sidewall insulating region also extends from the substrate face adjacent the first end of the insulated floating gate, across the first end of the insulated floating gate and onto the first end of the control gate. A sidewall electrode is formed on the sidewall insulating region opposite the insulated floating gate and the insulated control gate, such that the sidewall electrode extends from adjacent the first end of the insulated control gate onto the substrate face and further extends on the substrate face away from the sidewall insulating region. The sidewall electrode forming step preferably comprises the steps of forming a blanket electrode layer on the substrate on the sidewall insulating region and on the outer face of the insulated control electrode, and then patterning the blanket layer to remove a portion thereof on the substrate face and on the outer face of the insulated control gate.

Methods according to the present invention may also include the steps of forming a second sidewall insulating region extending from the substrate face adjacent the second end of the insulated floating gate across the second end of the insulated floating gate and onto the second end of the control gate. A second sidewall electrode is then formed on the sidewall insulating region opposite the insulated floating gate and the insulated control gate, such that the second sidewall electrode extends from adjacent the second end of the insulated control gate and onto the substrate face. Preferably, the steps of forming the extended sidewall electrode and the second sidewall electrode are simultaneously performed by forming a blanket electrode layer on the substrate face on the sidewall insulating region and on the outer face of the insulated control electrode, and patterning the blanket electrode layer to remove a portion thereof on the substrate face and on the outer face of the insulated control gate.

In a specific embodiment of a fabrication method according to the present invention, nonvolatile memory devices are formed by defining an active region and a field region by forming a field oxide layer for device isolation on a semiconductor substrate of a first conductivity type. A gate insulation film and a first conductive layer are formed on the surface of the semiconductor substrate having the field oxide layer formed thereon. A patterned conductive layer is formed by patterning the first conductive layer so that adjacent cells are isolated from each other.

A first insulation film, a second conductive layer and a second insulation film are then formed on the surface of the semiconductor substrate having the first patterned conductive layer thereon. A gate pattern comprising a second insulation film pattern, a second conductive layer pattern, a first insulation film pattern and a first conductive layer pattern, is then formed by patterning the second insulation film, the second conductive layer, the first insulation film and the patterned conductive layer to form a gate electrode including an insulated floating gate and an insulated control gate. A sidewall insulation film pattern is formed on both sidewalls of the gate electrode. A drain region of a second conductivity type is formed in the active region of one sidewall of the gate electrode.

A self-aligned contact hole which exposes the drain region is formed by etching the gate insulation film on the drain region. A blanket third conductive layer, filling the self-aligned contact hole is then formed. The third conductive layer is patterned to thereby form a pad layer which electrically controls the drain region and forms an extended sidewall gate electrode on the sidewall insulation film pattern opposite the drain region and which partially covers the gate insulation film pattern. A source region of the second conductivity type is formed in the semiconductor substrate adjacent the extended sidewall gate electrode.

According to the present invention, the programming speed of the cell is increased, improper operation due to an erased cell is reduced during a read operation and the resistance of a sidewall gate electrode is reduced, by forming an extended sidewall gate electrode having a large area adjacent the source region. Also, during the formation of the sidewall gate electrode, a wide third conductive layer pattern connected with the sidewall gate electrode may also be formed around the cell array area by patterning a third conductive layer. Therefore, since a contact hole for connecting a gate electrode to an address decoder may be directly formed on the pattern, fabrication may be simplified. Improved fabrication methods for nonvolatile memory devices are thereby provided.

BRIEF DESCRIPTION OF THE DRAWINGS

FIG. 5A through 10A are cross-sectional views taken along the line XX' of FIG. 4, illustrating a cell fabricating method according to an embodiment of the present invention; and FIGS. 5B and 6B are cross-sectional views taken along the line YY' of FIG. 4, illustrating a cell fabricating method according to an embodiment of the present invention.

DETAILED DESCRIPTION OF PREFERRED EMBODIMENTS

Figure 1:
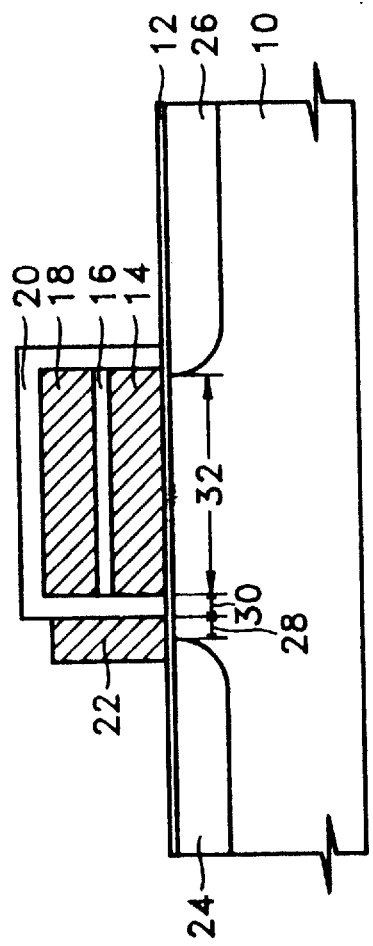
FIG. 1 is a cross-sectional view showing a cell structure of a conventional nonvolatile memory device having a floating polysilicon spacer.
Figure 2:
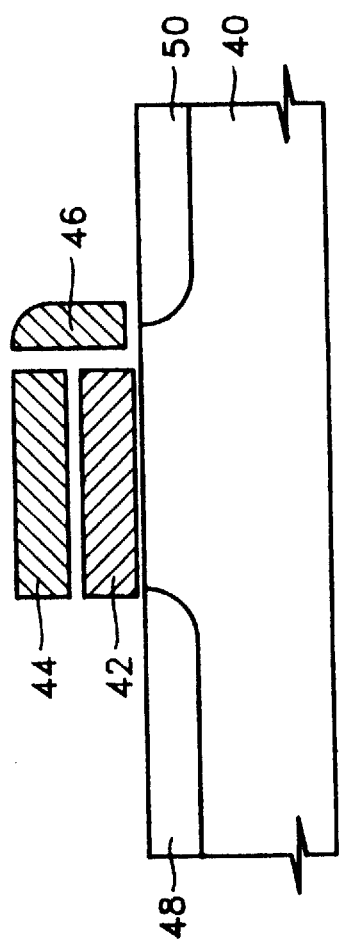
FIG. 2 is a cross-sectional view showing a cell structure of a conventional nonvolatile memory device having a sidewall gate electrode.
Figure 3:
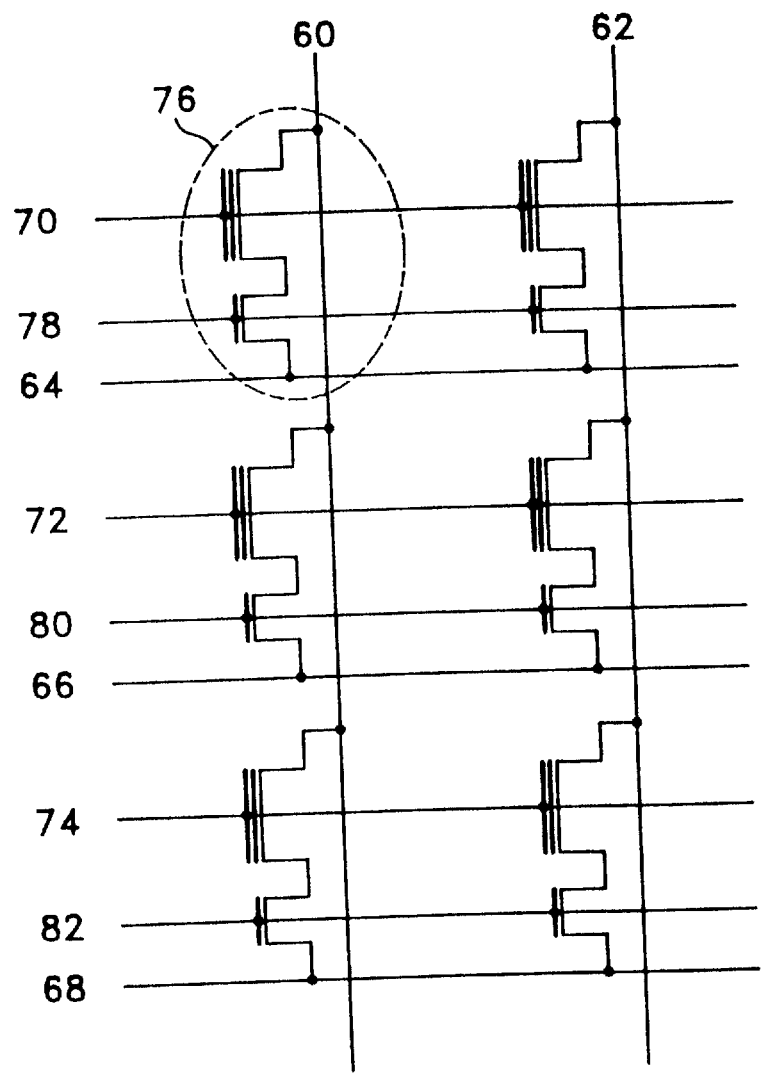
FIG. 3 is an equivalent circuit diagram of a portion of a cell array region of the cell shown in FIG. 2.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 4:
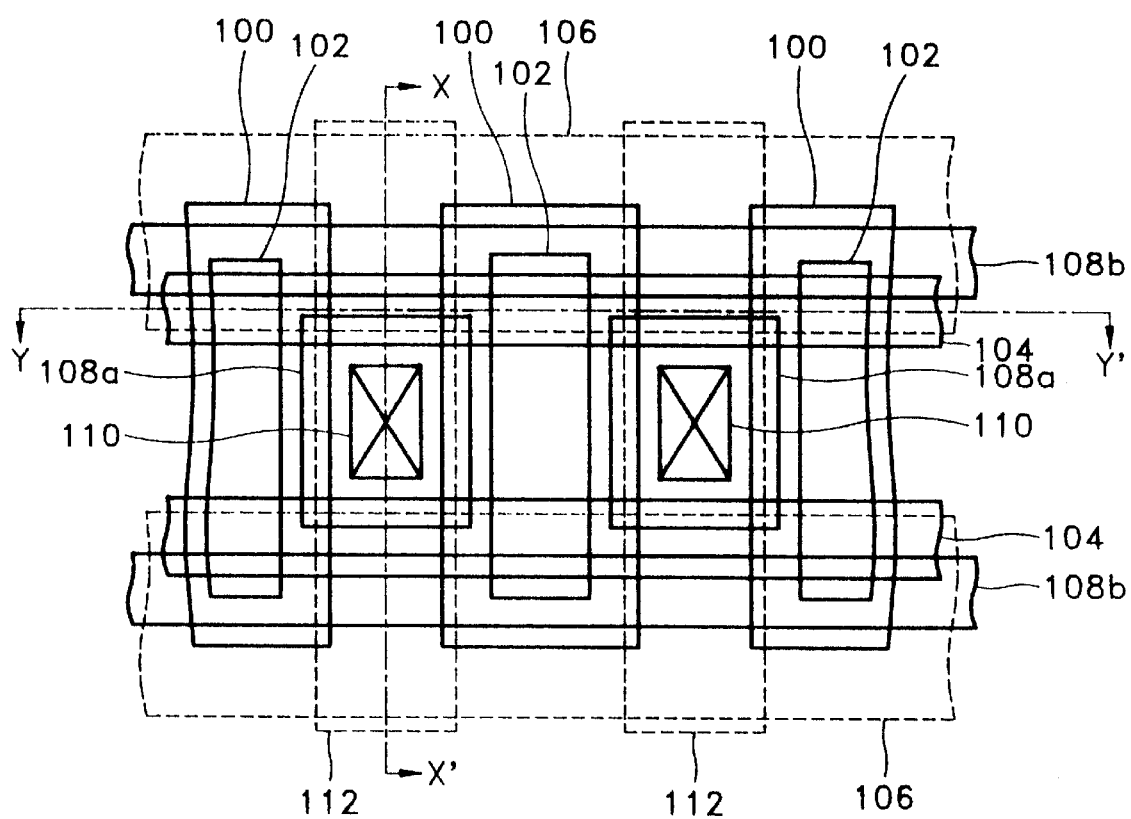
FIG. 4 is a cell layout of a nonvolatile memory according to the present invention.

Referring now to FIG. 4, a cell layout according to the present invention will be described. Reference numeral 100 represents a plurality of field oxide layer patterns for device isolation, and reference numeral 102 represents a floating gate isolation pattern disposed in field oxide layer patterns 100 for isolating floating gates of adjacent cells. Reference numeral 104 represents control gate electrode patterns traversing field oxide layer patterns 100 and the active region therebetween. Reference numeral 106 represents drain ion implantation patterns for exposing the active region between control gate electrode patterns 104 and forming a drain region in the exposed active region. Reference numeral 108*a* represents a pad layer pattern for covering the drain region. Reference numeral 108*b* represents a sidewall gate electrode pattern disposed to be overlapped with control gate electrode pattern 104 on the active region facing the drain region centered on control gate electrode pattern 104. Reference numeral 110 represents a bit contact pattern disposed on pad layer pattern 108*a*, and reference numeral 112 represents a bit line disposed to intersect control gate electrode pattern 104, and covering bit contact pattern 110.

Figure 5A:
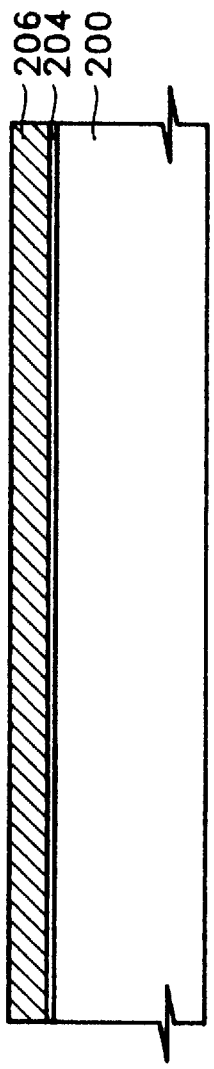
Figure 5B:
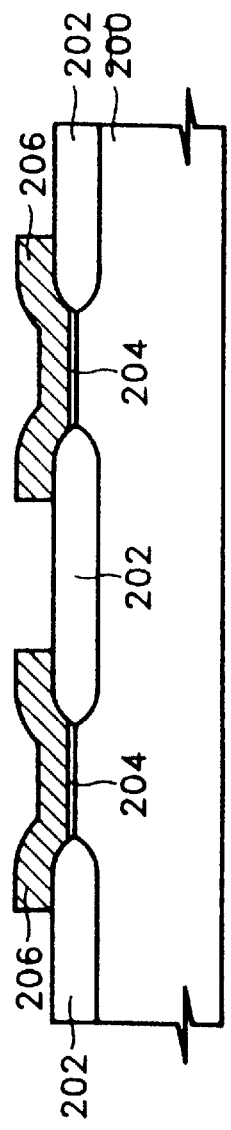

FIGS. 5A through 10A are cross-sectional views taken along the line XX' of FIG. 4, illustrating a cell manufacturing method according to an embodiment of the present invention, and FIGS. 5B and 6B are cross-sectional views taken along the line YY' of FIG. 4, illustrating a cell manufacturing method according to an embodiment of the present invention.

FIGS. 5A and 5B show the step of forming a first modified conductive layer 206. A field oxide layer 202 for device isolation is formed on a semiconductor substrate 200 of a first conductivity type. Then, a gate insulation film 204 and a first conductive layer, e.g., a polysilicon layer, are sequentially formed on the entire surface of the semiconductor substrate having field oxide layer 202 formed thereon. Subsequently, in order to isolate adjacent cells in the direction of a line YY' of FIG. 4 from each other, first modified conductive layer 206 is formed by patterning the first conductive layer.

FIGS. 6A and 6B show the step of forming a first conductive layer pattern 206A which provides a floating gate, and a second conductive layer pattern 210 which provides a control gate. A first insulation film, a second conductive layer and a second insulation film are sequentially formed on the entire surface of the semiconductor substrate having first modified conductive layer 206 formed thereon. Here, the first insulation film may be formed of an oxide layer, a nitride/oxide (NO) layer or an oxide/nitride/oxide (ONO) layer or other conventional insulators. The second conductive layer may be formed of a polysilicon layer, a tungsten polycide layer or other conventional conductive layers.

Still referring to FIGS. 6A and 6B, the second insulation film, second conductive layer, first insulation film and first modified conductive layer 206 are successively patterned using a mask in which the control gate electrode 104 shown in FIG. 4 is formed, to thereby form a gate pattern comprising a second insulation film pattern 212, a second conductive layer pattern 210, a first insulation film pattern 208 and a first conductive layer pattern 206A. Accordingly, an insulated floating gate is formed on the semiconductor substrate, having first and second ends, and an insulated control gate is formed on the insulated floating gate, opposite the semiconductor substrate, and including first and second ends. As shown in FIGS. 6A and 6B, since first conductive layer pattern 206A, i.e., the floating gate, is isolated from the floating gate of an adjacent cell, any selected cell is programmable or erasable.

Figure 7A:
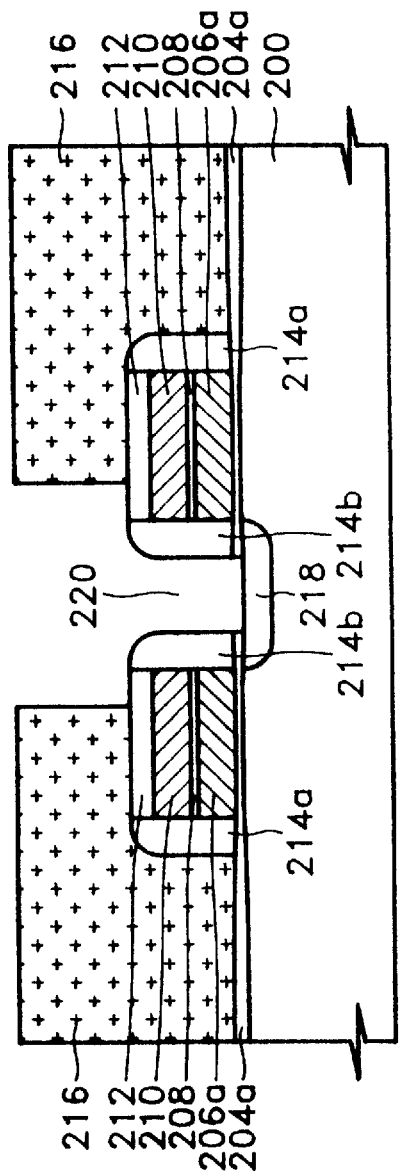

FIG. 7A shows the step of forming a gate insulation film pattern 204a having a drain region 218 and a self-aligned contact hole 220. First, sidewall insulation film patterns 214a and 214b, also referred to as a sidewall insulating region and a second sidewall insulating region respectively, are formed on both sidewalls of the gate pattern. Here, sidewall insulation film patterns 214a and 214b are formed of thermal oxide layers grown on the sidewalls (first and second ends) of the gate pattern by thermally oxidizing the semiconductor substrate having the gate patterns formed thereon, or of spacers formed on the sidewalls (first and second ends) of the gate pattern by depositing an insulation film on the whole surface of the semiconductor substrate having the gate patterns formed thereon and anisotropically etching the same. In the latter case, the thermal oxide layer is preferably grown at a high temperature after forming the spacers to reduce etch damage generated during the anisotropic etching process for forming the spacers, and then to thicken the anisotropically etched gate insulation film portion.

Still referring to FIG. 7A, first photoresist pattern 216 is formed using a mask in which the drain ion implantation pattern 106 shown in FIG. 4 is formed, so that the regions between second insulation film patterns 212 are alternately opened. Subsequently, impurities of a second conductivity type opposite to the first conductivity type are ion-implanted using the gate insulation film exposed by first photoresist pattern 216 as a screen layer, thereby forming drain region 218 of a second conductivity type underneath the exposed gate insulation film. Next, the exposed gate insulation film is etched to form a self-aligned contact hole 220 over drain region 218. The formation of the self-aligned contact hole 220 on drain region 218 minimizes the distance between sidewall insulation film patterns 214b.

Figure 8A:
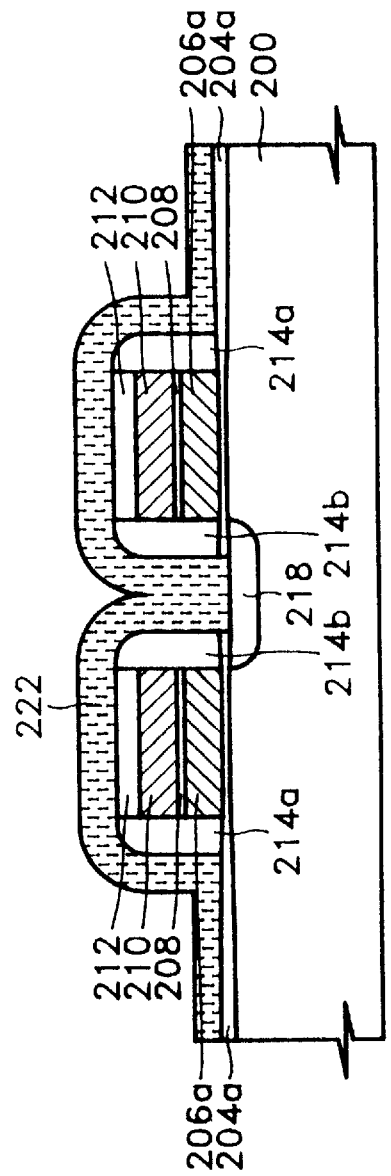

FIG. 8A shows the step of depositing a third conductive layer 222. First photoresist pattern 216 is removed. Subsequently, third conductive layer 222, such as, a polysilicon layer, for filling contact hole 220, is formed on the entire surface of the semiconductor substrate from which first photoresist pattern 216 is removed.

Figure 9A:
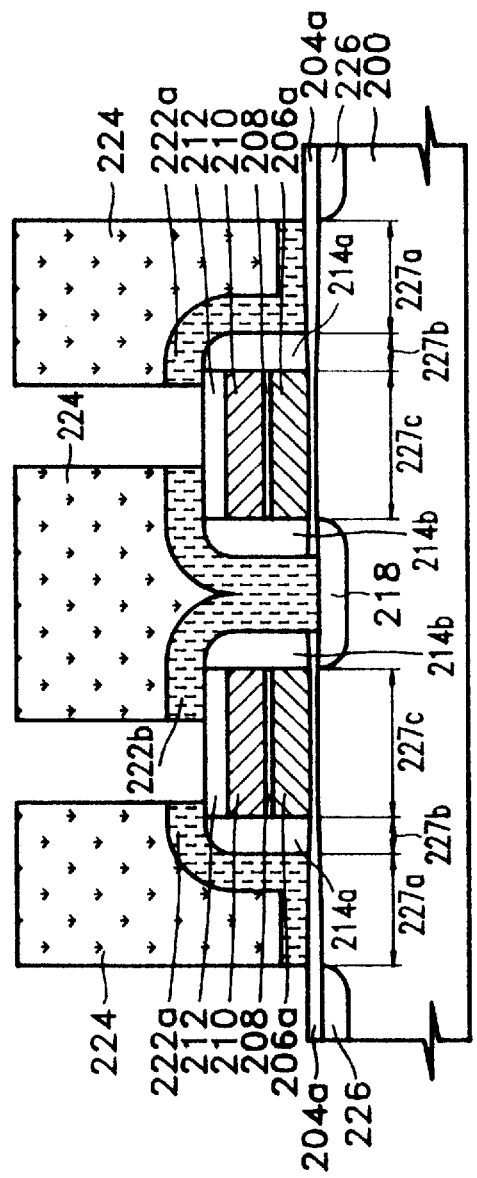

FIG. 9A shows the step of forming an extended sidewall electrode 222a (also referred to as a sidewall gate electrode) and a second sidewall electrode (also referred to as a pad layer) 222b, which are characteristic elements of the present invention. A second photoresist pattern 224 is formed on third conductive layer 222. Then, third conductive layer 222 is etched using second photoresist patterns 224 as an etch mask. This forms sidewall gate electrode 222a covering sidewall insulation film pattern 214a on opposite sides of drain region 218 and a part of the gate insulation film and, at the same time, forming pad layer 222b over drain region 218.

As shown, the cross-sectional area of sidewall gate electrode 222a is much larger than that of the conventional sidewall gate electrode formed of a spacer, thereby greatly decreasing the resistance thereof. Therefore, when a sidewall gate electrode is selected, the signal transmission speed is considerably improved. Also, since the sidewall gate electrode is formed by photolithography/etching process, a wide pattern (not shown) connected to the sidewall gate electrode and comprised of third conductive layer 222 may be simultaneously formed in the outside of a cell array during the formation of the sidewall gate electrode. Therefore, a contact hole for connecting the output line of an address decoder (not shown) with the sidewall gate electrode may be efficiently formed on the wide pattern.

Still referring to FIG. 9A, impurities of a second conductivity type are implanted into the surface of the semiconductor substrate beside sidewall gate electrode 222a, thereby forming a source region 226 of a second conductivity type and, at the same time, defining a channel region between source region 226 and drain region 218. Here, the channel region is composed of first channel region 227a in the semiconductor substrate surface portion under sidewall gate electrode 222a, a second channel region 227b in the semiconductor substrate surface portion under sidewall insulation film pattern 214a, and a third channel region 227c in the semiconductor substrate surface portion under first conductive layer pattern 206A. Second channel region 227b improves the programming speed by increasing the programming efficiency when the information is programmed on a cell, as shown in FIG. 1.

Figure 10A:
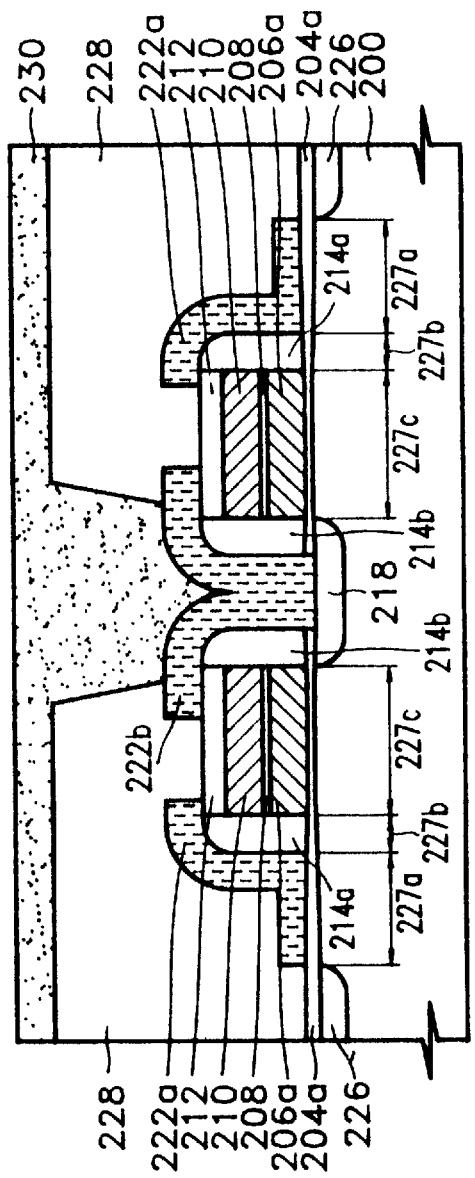

FIG. 10A shows the steps of completing a cell of the nonvolatile memory device according to the present invention. First, the second photoresist pattern 224 is removed. Then, a third planarized insulation film is formed on the whole surface of the resultant structure in a conventional method and then the third planarized insulation film is patterned, thereby simultaneously forming a bit contact hole which exposes pad layer 222b and third insulation film pattern 228. Subsequently, a bit line 230 is formed on third insulation film pattern 228 and filling the bit line contact hole, thereby completing a cell of a nonvolatile memory device according to the present invention.

Thus, according to an embodiment of the present invention, the extended sidewall electrode having a large area is patterned by a photolithography/ etching process, thereby increasing the cell programming efficiency, preventing improper operation due to an erased cell, greatly reducing the resistance of a sidewall gate electrode and increasing the process margins. When a sidewall gate electrode is selected, the RC delay time, which depends on the resistance of the selected sidewall gate electrode, is considerably reduced, thereby improving operational speed.

Also, a wide pattern connected to the sidewall gate electrode can be concurrently formed in a third conductive layer in the vicinity of a cell array region. Therefore, a contact hole for electrically connecting the output line of an address decoder can be formed directly on the wide pattern, thereby simplifying the process. Finally, a self-aligned contact hole is formed on the drain region, thereby decreasing the cell area.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a nonvolatile semiconductor memory device comprising the steps of:

forming on a face of a semiconductor substrate, an insulated floating gate and an insulated control gate on said insulated floating gate, said insulated floating gate and said insulated control gate each including first and second ends, a first sidewall insulating region extending from said substrate face adjacent said first end of said insulated floating gate, across said first end of said insulated floating gate and onto said first end of said control gate and a second sidewall insulating region extending from said substrate face adjacent said second end of said insulated floating gate, across said second end of said insulated floating gate and onto said second end of said insulated control gate; and forming a first extended sidewall electrode on said first sidewall insulating region opposite said insulated floating gate and said insulated control gate, said first extended sidewall electrode extending from adjacent said first end of said insulated control gate and onto said substrate face, and further extending on said substrate face away from said first sidewall insulating region and forming a second sidewall electrode on said second sidewall insulating region opposite said insulated floating gate and said insulated control gate, said second sidewall electrode extending from adjacent said second end of said insulated control gate and onto said substrate face.

2. A method according to claim 1 wherein said insulated control gate further includes an outer face opposite said insulated floating gate, and wherein said step of forming a first and a second extended sidewall electrode comprises the step of:

forming a blanket electrode layer on said substrate face, on said first and second sidewall insulating regions and on said outer face of said insulated control gate; and patterning said blanket electrode layer to remove a portion thereof on said substrate face and on said outer face of said insulated control gate.

3. A method according to claim 1 wherein said insulated control gate further includes an outer face opposite said insulated floating gate, and wherein said step of forming a first extended sidewall electrode further comprises the step of forming a first extended sidewall electrode which extends from said sidewall insulating region onto said outer face of said insulated control gate.

4. A method according to claim 1 wherein said insulated control gate further includes an outer face opposite said insulated floating gate, and wherein said step of forming a second sidewall electrode comprises the step of forming a second sidewall electrode which extends from said sidewall insulating region onto said outer face of said insulated control gate.

5. A method according to claim 1 wherein the following step is performed prior to said step of forming said first and second extended sidewall electrodes:

forming an insulating layer on said substrate face, extending away from said first and second sidewall insulating region.

6. A method according to claim 1 wherein said insulated control gate further includes an outer face opposite said insulated floating gate, and wherein said step of forming a first extended sidewall electrode and a second sidewall electrode are preformed simultaneously by performing the following steps:

forming a blanket electrode layer on said substrate face, on said first and second sidewall insulating regions and on said outer face of said insulated control gate; and patterning said blanket electrode layer to remove a portion thereof on said substrate face and on said outer face of said insulated control gate.

7. A method of fabricating a nonvolatile memory device, comprising the steps of:

defining an active region and a field region by forming a field oxide layer for device isolation on a semiconductor substrate of a first conductivity type;

sequentially forming a gate insulation film and a first conductive layer on the surface of the semiconductor substrate having said field oxide layer formed thereon;

forming a patterned conductive layer by patterning said first conductive layer;

sequentially forming a first insulation film, a second conductive layer and a second insulation film on the surface of the semiconductor substrate having said patterned conductive layer thereon;

forming a gate pattern comprising a second insulation film pattern, a second conductive layer pattern, a first insulation film pattern and a first conductive layer pattern, by patterning said second insulation film, said second conductive layer, said first insulation film and said patterned conductive layer to form a gate electrode including an insulated floating gate and an insulated control gate;

forming a sidewall insulation film pattern on both sidewalls of said gate electrode;

forming a drain region of a second conductivity type in the active region adjacent one sidewall of said gate electrode;

forming a blanket third conductive layer on the semiconductor substrate;

patterning the third conductive layer to thereby form a pad layer which electrically contacts the drain region and forms an extended sidewall electrode on said sidewall insulation film pattern opposite said drain region and which partially covers said gate insulation film pattern; and forming a source region of the second conductivity type on the surface of the semiconductor substrate adjacent said extended sidewall electrode.

8. A method according to claim 7, further comprising the steps of:

forming a blanket third planarized insulation film on the surface of the semiconductor substrate;

forming a third insulation film pattern having a bit line contact hole on said pad layer by patterning said third insulation film; and forming a bit line covering said bit contact hole.

9. A method according to claim 7, wherein said sidewall insulation film pattern is selected from the group consisting of a thermally grown oxide layer and a spacer formed by anisotropic etching.

* * * * *

UNITED STATES PATENT AND TRADEMARK OFFICE
CERTIFICATE OF CORRECTION

PATENT NO. : 5,821,143

DATED : October 13, 1998

INVENTOR(S) : Kim et al

It is certified that error appears in the above-identified patent and that said Letters Patent is hereby corrected as shown below:

On the title page: Item [56]

Under References Cited - U.S. Patent Documents, please add the following references.

| | | | |
|---|---|---|---|
| 5,455,792 | 10/995 | Yi | 365/185.12 |
| 5,235,544 | 8/1993 | Caywood | 365/185 |
| 4,794,565 | 12/1988 | Wu et al. | 365/185 |

Signed and Sealed this

Second Day of March, 1999

Attest:

Attesting Officer

Q. TODD DICKINSON

Acting Commissioner of Patents and Trademarks